United States Patent [19]

Heller

[11] 4,230,954
[45] Oct. 28, 1980

[54] PERMANENT OR SEMIPERMANENT CHARGE TRANSFER STORAGE SYSTEMS

[75] Inventor: Lawrence G. Heller, Essex Junction, Vt.

[73] Assignee: International Business Machines Corporation, Armonk, N.Y.

[21] Appl. No.: 974,409

[22] Filed: Dec. 29, 1978

[51] Int. Cl.³ .................. H03K 5/00; H01L 29/78; G11C 11/34; H01L 29/34
[52] U.S. Cl. .................. 307/238; 357/23; 357/24; 357/45; 357/54; 357/89; 365/183
[58] Field of Search .................. 357/23, 24, 41, 45; 365/149, 183; 307/238

[56] References Cited

U.S. PATENT DOCUMENTS

| | | | |
|---|---|---|---|
| 3,654,999 | 4/1972 | Smith | 357/24 |
| 3,819,959 | 6/1974 | Chang et al. | 357/24 |
| 3,903,543 | 9/1975 | Smith | 357/24 |
| 3,911,464 | 10/1975 | Chang et al. | 357/24 |
| 4,014,036 | 3/1977 | Ho et al. | 357/24 |
| 4,021,789 | 5/1977 | Furman et al. | 357/24 |
| 4,040,016 | 8/1977 | Lee et al. | 357/24 |
| 4,040,017 | 8/1977 | Lee | 357/24 |
| 4,040,077 | 8/1977 | Ichon | 357/24 |
| 4,072,977 | 2/1978 | Bate et al. | 357/24 |
| 4,080,590 | 3/1978 | Pricer | 357/24 |

FOREIGN PATENT DOCUMENTS 1374009  11/1974  United Kingdom .

OTHER PUBLICATIONS

Unis "Charge-Coupled Device Dynamic Memory Cell" IBM Technical Disclosure Bulletin, vol. 21 (11/78) pp. 2262-2263.

Chan et al. "Charge-Coupled Memory Device" Applied Physics Lett., vol. 22 (15 Jun. 73) pp. 650-652.

*Primary Examiner*—Gene M. Munson
*Attorney, Agent, or Firm*—Stephen J. Limanek

[57] ABSTRACT

Storage systems are provided with memory cells made of devices having different voltage thresholds for storing information permanently or semipermanently. The devices are arranged adjacent to each other and communicating with a diffusion region in a semiconductor substrate. Information is sensed by detecting the charge transferred from a selected cell to the diffusion region. In an embodiment of the invention, a P-type substrate has an N+ diffusion region formed therein with a plurality of adjacent and parallelly arranged word lines insulated from the substrate and disposed adjacent to the N+ diffusion region. A P+ region, preferably implanted into the substrate, is disposed under selected segments of the word lines to provide devices having a first or high threshold voltage magnitude. The remaining devices which are not associated with a P-30 region have a second or low threshold voltage magnitude. By applying a voltage of the same magnitude to each of the word lines, potential wells are formed which are filled by charge or carriers from the diffusion region. Since the potential wells associated with the high threshold devices hold less charge than do the low threshold devices, a charge or voltage sensing circuit connected to the N+ diffusion region is used to detect the amount of charge flowing between the wells and the diffusion region to thus identify the high and low threshold devices when the voltage on the selected word line is decreased. By eliminating the P+ regions and storing charge, e.g., electrons, at selected locations under the word lines in dual insulating layers, the cells may be electrically programmable.

18 Claims, 7 Drawing Figures

PERMANENT OR SEMIPERMANENT CHARGE TRANSFER STORAGE SYSTEMS

DESCRIPTION

1. Technical Field

This invention relates to charge transfer systems and more particularly to improved storage systems in which information is stored permanently or semipermanently.

2. Background Art

Integrated semiconductor memory systems have achieved a high density of cells. In commonly assigned British Patent Specification No. 1,374,009 by N. G. Anantha and T. Chiu, there is disclosed a memory system having cells each of which includes a charge storage electrode and a bit line diffusion region in a semiconductor substrate with a gate electrode controlling the flow of charge between the diffusion region and a storage capacitor defined by the charge storage electrode. This type of system is known as a system employing one device memory cells. Commonly assigned U.S. Pat. No. 4,014,036, by I. T. Ho and H. N. Yu, discloses a memory system similar to that taught in the British Patent Specification but uses a single unitary electrode for storing and transferring charge to the bit line diffusion region.

In commonly assigned U.S. Pat. No. 4,040,017 by H. S. Lee, there is disclosed a memory system having cells formed by a plurality of spaced apart and parallelly arranged bit lines with a word line controlling the flow of charge between a diffusion region and potential wells defined by the word lines to provide a very dense array of read/write random access memory cells. To facilitate the formation of this dense array, the bit lines are made of doped polycrystalline silicon, or doped polysilicon. U.S. Pat. No. 4,021,789 by A. Furman, H. L. Kalter and J. W. Nagel, also commonly assigned, discloses another very dense read/write random access memory array produced by an improved process technique utilizing two layers of doped polysilicon.

Memory systems employing charge coupled devices (CCD), such as disclosed in commonly assigned U.S. Pat. No. 3,819,959 by J. J. Chang and J. W. Sumilas, are known for their very high density of storage cells and simple fabrication, but these systems, which read out charge serially, have a slow access time.

In U.S. Pat. No. 3,654,499, filed June 24, 1970, a charge coupled (CCD) device system is described wherein information is stored permanently by employing thick and thin insulators at carrier accumulation stages and the information is shifted out of the system in the normal serial read out mode.

Commonly assigned U.S. Pat. No. 3,911,464, by W. H. Chang and H. S. Lee, discloses an array somewhat similar to that disclosed in the above-mentioned U.S. Pat. No. 4,014,036 but with each memory element comprised of a variable threshold voltage field effect gate region located near a single sensing diffusion.

DISCLOSURE OF THE INVENTION

It is an object of this invention to provide an improved storage system having a higher density of storage cells than that found in other semiconductor systems.

Another object of this invention is to provide a high density charge storage system having improved performance by reading out charge in a random access rather than a serial manner.

Yet another object of this invention is to provide an improved charge storage system wherein information is stored permanently or semipermanently in a very dense array of cells.

Still another object of this invention is to provide an improved low cost charge storage system wherein information is stored permanently or semipermanently and the information is read out in a random access rather than a serial manner.

A further object of this invention is to provide an improved random access charge storage system wherein bit/sense lines used to access the cells of the system have very low capacitance, substantially lower than the capacitance of bit/sense lines formed in conventional random access memory systems employing one device cells.

Yet a further object of this invention is to provide an improved charge storage system wherein information is stored permanently or semipermanently by utilizing devices at cell locations which have different threshold voltages.

In accordance with the teachings of this invention, storage systems are provided with memory cells made of devices having high and low threshold voltages for storing information permanently or semipermanently to represent binary digits 0 and 1, respectively. The devices are arranged adjacent to each other and communicating with a diffusion region in a semiconductor substrate. Information is sensed by detecting the charge transferred from a selected cell to the diffusion region. In an embodiment of the invention, a P-type substrate has an N+ diffusion region formed therein with a plurality of adjacent and parallelly arranged word lines insulated from the substrate and disposed adjacent to the N+ diffusion region. A P+ region, preferably implanted into the substrate, is disposed under selected segments of the word lines to provide devices having a first or high threshold voltage. The remaining devices which do not have word lines associated with a P+ region have a second or low threshold voltage. By applying a voltage of the same magnitude to each of the word lines, potential wells are formed which are filled by charge or carriers from the diffusion region. Since the potential wells associated with the high threshold voltage devices hold less charge than do the low threshold voltage devices, a charge or voltage sensing circuit connected to the N+ diffusion region can be used to detect the amount of charge flowing between the wells and the diffusion region when the voltage on the selected word line is decreased to thus distinguish between the high and low threshold voltage devices. By eliminating the P+ regions and storing charge at selected locations under the word lines in dual insulating layers, the cells may be electrically programmable and erasable.

In another aspect of this invention a plurality of diffusion regions are formed in the substrate with a bit/sense line connected or stitched to the diffusion regions and a plurality of parallelly-arranged word lines are disposed between adjacent pairs of diffusion regions. By selecting only the plurality of word lines disposed between one pair of diffusion regions, the bit/sense line connected to this pair of regions exhibits a very low capacitance.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
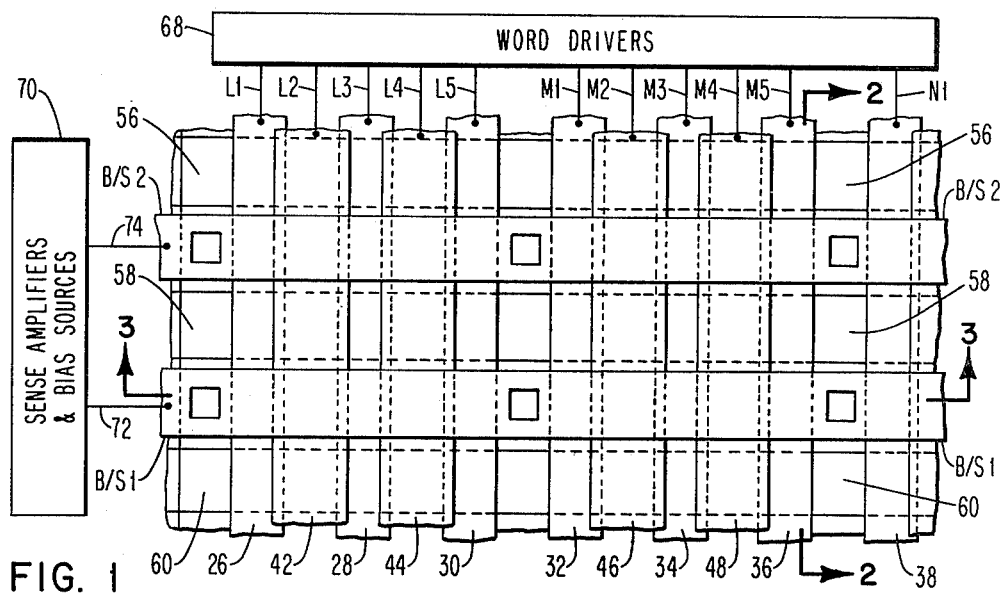
FIG. 1 is primarily a plan view of a first embodiment of a semiconductor memory array of the present invention.
Figure 3:
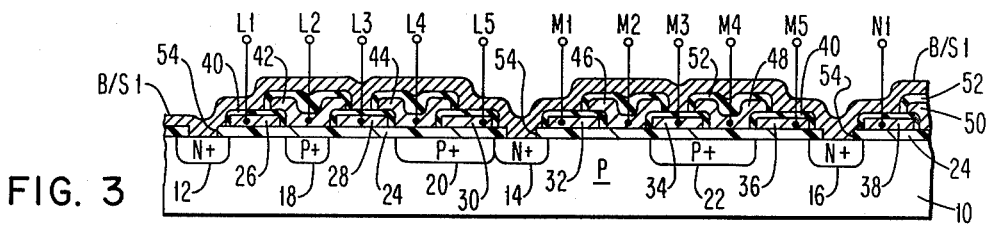
FIG. 3 is a section taken through FIG. 1 at 3—3.
Figure 2:
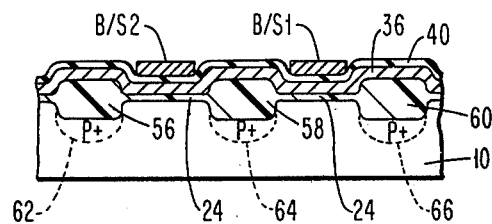
FIG. 2 is a section taken through FIG. 1 at 2—2.

Referring to FIGS. 1, 2 and 3 of the drawings in more detail, there is shown the memory array of a first embodiment of the invention which includes a P-type semiconductor substrate 10 having disposed therein N+ diffusion regions 12, 14 and 16 spaced apart at regular intervals along the surface of substrate 10, which may be formed in a known manner by, e.g., diffusing arsenic into substrate 10 through any suitable mask. Also disposed within substrate 10, at the surface thereof, are a plurality of P+ diffusion regions 18, 20 and 22 formed at selected locations. The P+ diffusion regions may be formed by, e.g., selectively implanting boron into the surface of the substrate 10. A thin insulating layer, preferably made of silicon dioxide 24, is formed over the surface of substrate 10. Deposited over the silicon dioxide 24 is a first doped polysilicon layer etched to provide parallel word lines 26, 28, 30, 32, 34, 36 and 38, with word line 26 being positioned adjacent to N+ diffusion 12, word lines 30 and 32 being positioned adjacent to and on opposite sides of N+ diffusion 14 and word lines 36 and 38 being positioned adjacent to and on opposite sides of N+ diffusion 16. The polysilicon word lines 26 through 38 are oxidized to form an insulating layer 40 over each of these first polysilicon word lines. A second doped polysilicon layer is deposited over the surface of the resulting structure and etched to form parallel word lines 42, 44, 46, 48 and 50 between word lines 26 through 38. The polysilicon word lines 42 through 50 are oxidized to form an insulating layer 52 over each of these second polysilicon word lines. A layer of metal, preferably made of aluminum or copper-doped aluminum, is deposited over this resulting structure and etched into parallel strips arranged orthogonal to the word lines 26 through 38 and 42 through 50 to form bit/sense lines B/S1 and B/S2. Bit/sense line B/S1 is connected or stitched to N+ diffusion regions 12, 14 and 16 through openings 54 in the silicon dioxide layer 24, with bit/sense line B/S2 connected or stitched to similar diffusion regions, not shown.

Recessed oxide strips 56, 58 and 60 are formed in substrate 10 between and parallel to the bit/sense lines B/S1 and B/S2 for providing isolation between the thin silicon dioxide layers or channels. To further improve the isolation between the channels, P+ regions 62, 64 and 66, as indicated in FIG. 2, may be formed between the channels prior to forming the recessed oxide strips 56, 58, and 60.

Conventional word drivers 68 are connected to word lines 26 through 38 and 42 through 50, with word lines 26, 42, 28, and 44 and 30 being connected to word drivers 68 through terminals L1, L2, L3, L4 and L5, respectively, word lines 32, 46, 34, 48 and 36 being connected to word drivers 68 through terminals M1, M2, M3, M4 and M5, respectively, and word line 38 being connected to word drivers 68 through terminal N1. The word drivers 68 may include any known drivers capable of selectively providing a voltage VH, e.g., of +8.5 volts and zero or ground potential. Bit/sense lines B/S1 and B/S2 can be connected to conventional sense amplifiers and bias sources 70 through terminals 72 and 74, respectively. The sense amplifiers may be of the charge transfer detector type disclosed in commonly assigned U.S. Pat. No. 3,764,906 by L. G. Heller or of the well known cross-coupled type disclosed in U.S. Pat. No. 3,588,844, filed July 7, 1969. The bias sources may be any source of positive voltage capable of providing a substantially constant voltage having a magnitude somewhat less than VH minus the voltage threshold $V_{th}$ of the devices in the array.

Figure 4:
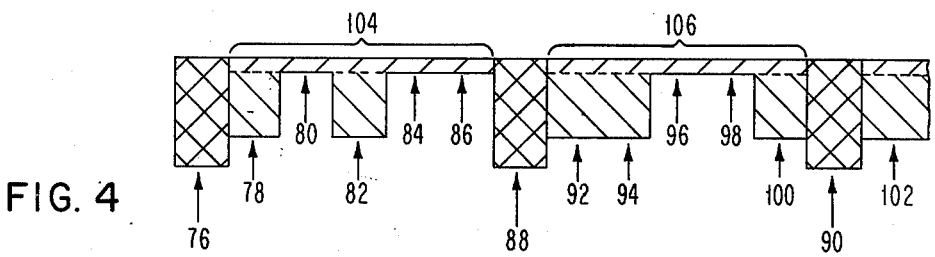
FIG. 4 is a schematic diagram indicating potential wells formed in the system of the invention illustrated in FIGS. 1, 2 and 3 prior to a read out operation.

Referring to FIG. 4 there is shown a schematic diagram indicating potential wells formed under the word lines of the embodiment of the invention illustrated in FIGS. 1, 2 and 3 prior to a read out operation. The N+ diffusion region 12 provides a source of charges, that is, electrons which is represented in FIG. 4 by well 76. By applying voltages of +8.5 volts to terminals L1, L2, L3, L4 and L5 potential wells 78, 80, 82, 84, and 86 are formed in semiconductor substrate 10 under word lines 26, 42, 28, 44 and 30, respectively, as indicated in FIG. 4. N+ diffusion region 14 is indicated as a charge source 88 and N+ diffusion region 16 is indicated as a charge source 90. With +8.5 volts applied to terminals M1, M2, M3, M4 and M5, potential wells 92, 94, 96, 98 and 100 are formed in substrate 10 under word lines 32, 46, 34, 48 and 36, respectively, and with +8.5 volts applied to terminal N1, a potential well 102 is formed in substrate 10 under word line 38. It should be noted that where a P+ diffusion region, such as, region 18 formed under a word line 42, a high threshold is exhibited and, therefore, the potential well 80 is relatively shallow compared with potential wells 78 and 82 which are not associated with a P+ diffusion region. The high threshold voltage devices in the array are formed by a polysilicon word line, the silicon dioxide layer 24 and a P+ diffusion region having a relatively high concentration of impurities, such as, boron, compared with the P-type impurities found in the main body of the semiconductor substrate 10 where the low threshold devices are formed. It should also be noted that when +8.5 volts is applied to each of the terminals L1, L2, L3, L4 and L5 a continuous potential well channel 104 is formed between the N+ diffusion regions 12 and 14 so that charge can be transferred to any potential well, such as, well 82 from either of the N+ diffusion regions 12 or 14 when the voltage at the N+ diffusions is less than VH minus $V_{th}$. It can be seen that a similar potential well channel 106 is formed between N+ diffusion region 14 and N+ diffusion region 16 when a voltage of +8.5 volts is applied to word lines M1, M2, M3, M4 and M5.

Figure 5:
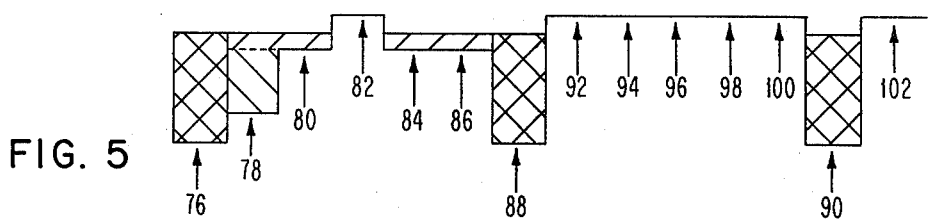
FIG. 5 is a schematic diagram indicating potential wells formed in the system of the invention during a read out operation.
Figure 6:
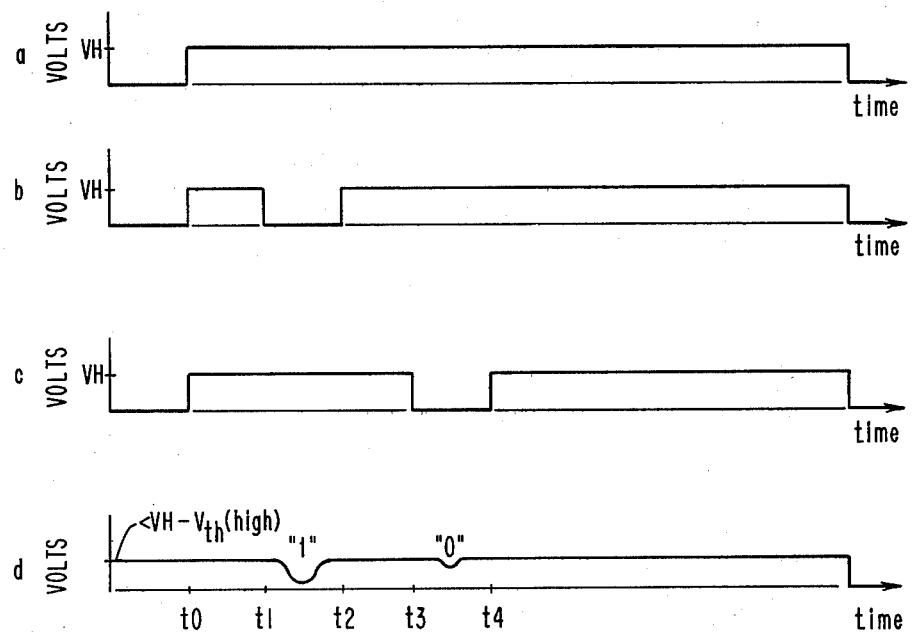
FIG. 6 is a pulse program which may be used to operate the system illustrated in FIGS. 1, 2 and 3.

In order to read out information from word lines within a selected section of the bit/sense line B/S1, e.g., the section disposed between N+ diffusion region 12 and N+ diffusion region 14, the potential on all word lines, except those within the selected section, is maintained at zero or ground potential. The voltage on each of the word lines, i.e., lines 26, 42, 28, 44 and 30, within the selected section is at VH or +8.5 volts, as indicated in FIG. 6 at a, and the voltage on N+ diffusion regions 12 and 14 is somewhat less than VH minus $V_{th}$ of the high threshold voltage devices. To read the information stored in, for example, potential well 82 under word line 28, the word line voltage at terminal L3 is reduced to zero or ground potential as indicated in FIG. 6 at b, between times t1 and t2. With terminal L3 at ground potential the potential well 82 is reduced and takes the form indicated in FIG. 5 with all of the charge originally contained in well 82 being pushed out of well 82 and transferred to the N+ diffusion regions 12 and 14 via potential well channel 104 and bit/sense line B/S1 where it is detected by the sense amplifiers 70. The signal detected by sense amplifiers 70 is indicated in FIG. 6 at d between times t1 and t2 and represents a "1" binary digit of information. Since the terminals M1, M2, M3, M4, M5 and N1 are also at zero volts, potential wells 92, 94, 96, 98, 100 and 102 are similarly modified as indicated in FIG. 5 of the drawing. To read out another binary digit from the bit/sense line section between N+ diffusion region 12 and N+ diffusion region 14, the 8.5 volts is restored to terminal L3 and the voltage at, for example, L2 and thus at word line 42, is reduced to zero or ground potential between times t3 and t4 as indicated in FIG. 6 at c to produce a relatively minor voltage variation in bit/sense line B/S1 between times t3 and t4 as shown in FIG. 6 at d, representing binary digit "0". Since well 80, which is associated with word line 42 is not as deep as potential well 82, less charge had been stored in well 80 than in well 82 and, therefore, a smaller charge variation had been detected on bit/sense line B/S1.

It can be seen that if a high threshold voltage represents a binary digit 0 and a low threshold voltage represents a binary digit 1, the charge in the potential well associated with a high threshold voltage device may be represented by Q0 and the charge stored in the potential well associated with a low threshold voltage device can be represented by Q1. The difference between these two charges ΔQ is the charge margin which distinguishes between a 1 and a 0 binary digit. The charge ΔQ is equal to $C_{ox}[V_{th}(high)-V_{th}(low)]$, where $C_{ox}$ is the capacitance defined by the silicon dioxide layer 24, $V_{th}$(high) is the voltage threshold of a device which includes a P+ diffusion region and $V_{th}$(low) is the voltage threshold of a device which does not contain a P+ diffusion region.

Although P+ diffusion regions have been disclosed to provide high voltage thresholds, it should be understood that N+ diffusion regions could be formed in substrate 10 to selectively provide voltage thresholds lower than the voltage thresholds produced when utilizing only the P-type semiconductor substrate 10, as, e.g., under word lines 26 and 28.

It can also be seen that the charge from any potential well located between N+ diffusion region 12 and N+ diffusion region 14 flows to each of these diffusion regions to improve the performance of this memory array. It should also be noted that where, for example, a block transfer of information is required, information stored in wells 78, 80, 82, 84 and 86 may be read out sequentially without returning the associated word lines 26, 42, 28, 44 and 30 to voltage VH. It should be further noted that by grounding all of the word lines, except the word lines under the selected section of the bit/sense line, the bit/sense line exhibits a very low capacitance, since an inversion layer is formed only at the surface of the semiconductor substrate in the selected section. Thus the bit/sense line has a very high transfer ration which can readily accommodate a high number of storage cells, for example, 128 cells or more, without restoring to the use of complex or sophisticated sensing systems. Also, only five word lines are illustrated between two N+ diffusion regions in the interest of clarity, but in practice many more word lines would be interposed.

It is seen that the system of the present invention utilizes nearly one-half of the surface area of the substrate as storage area and thus each cell approaches only about two squares of surface area, where in this instance a square can be defined as the intersection of the thin silicon dioxide layer 24 with a word line. This size is considerably smaller than even the cell area used in serial charge coupled device systems since in the latter systems semiconductor substrate surface is required for the transfer gates associated with each storage area.

In view of the small size of the cells in the array of the present invention, it may be preferred to increase the sense amplifier pitch by sharing several bit/sense lines with one sense amplifier. The accessed bit/sense line can be switched to the sense amplifier and the non-accessed or other bit/sense lines can be floated or biased to the voltage VH.

Figure 7:
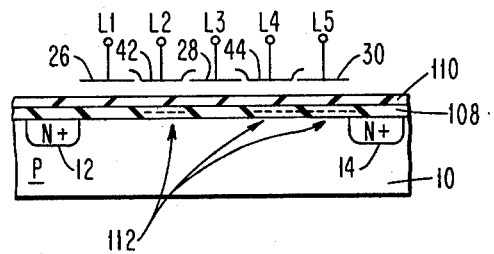
FIG. 7 is a section similar to a portion of that shown in FIG. 3 of a second embodiment of the invention.

In the embodiment of the invention illustrated in FIGS. 1, 2 and 3 of the drawing, the information is stored in the arrays in permanent form. In a second embodiment of the present invention, the information may be stored in a semi-permanent form as an electrically programmable read-only memory (EPROM) by introducing charge under selected segments of the word lines in the insulating or dielectric layer, as indicated in FIG. 7 of the drawing, which is a section similar to a portion of that shown in FIG. 3 of the drawing. In the embodiment indicated in FIG. 7, a first layer of insulation, preferably a thin layer of silicon dioxide 108, is formed on the surface of the semiconductor substrate 10 with a second insulating layer, preferably silicon nitride 110, deposited over the silicon dioxide layer 108. To form the high threshold voltage device, charges, for example, electrons, are introduced into the insulating layers 108, 110, preferably near the interface, as indicated at 112 in FIG. 7. In this embodiment it can be seen that the charge is located under word lines 42, 44 and 30 to provide the high threshold voltage which was provided by the P+ diffusion regions 18 and 20 in the first embodiment.

To write information into the embodiment indicated by FIG. 7, the charges 112 are introduced into the dual insulating layers 108 and 110 by applying a high positive voltage, for example, between 20 and 30 volts to terminals L2, L4 and L5, while zero voltage is applied to the N+ diffusion regions 12 and 14. To erase the array, that is, to drive out the charge stored under the word lines 42, 44 and 30, a negative voltage of about 20 to 30 volts is applied to terminals L2, L4 and L5, as is known. Thereafter, new information may be stored under any desired word line by again applying the high voltage of 20 to 30 volts to selected terminals. The system may then be operated in the manner as disclosed hereinabove in connection with the first embodiment illustrated in FIGS. 1, 2 and 3.

Accordingly, this invention provides charge transfer storage systems which are simple to make, very dense, low cost and have improved performance when used to store information permanently or semipermanently. Furthermore, in the system of this invention while charge is pushed out and read randomly from any given cell of the plurality of pre-programmed cells the information stored in the other cells of the array is not disturbed.

While the invention has been particularly shown and described with reference to preferred embodiments thereof, it will be understood by those skilled in the art that various changes in form and details may be made without departing from the spirit and scope of the invention.

What is claimed is:

1. A storage system comprising:
   a semiconductor substrate of a first conductivity type;
   a first diffusion region of a second conductivity type disposed within said substrate;
   a plurality of adjacent devices coupled to said substrate having different threshold voltages and disposed adjacent to said diffusion region;
   means for transferring charge from said diffusion region to each of said devices; and
   means coupled to said diffusion region for selectively detecting charge stored in said devices.

2. A storage system as set forth in claim 1 wherein said plurality of devices are arranged to form a continuous charge channel from each of said devices to said diffusion region.

3. A storage system as set forth in claim 1 wherein each of said devices includes a conductive film and a dielectric medium disposed between said film and said substrate.

4. A storage system as set forth in claim 3 wherein said substrate has first and second impurity regions at the surface thereof and said conductive films are coupled to said first and second impurity regions selectively such that a given number of said devices have a first threshold voltage magnitude and the remaining devices have a second threshold voltage magnitude.

5. A storage system as set forth in claim 4 wherein said first conductivity of said semiconductor substrate is a P-type conductivity, said second conductivity type of said first diffusion region is an N+ type conductivity and said first and second impurity regions of said substrate are P-type conductivity and P+ conductivity.

6. A storage system as set forth in claim 3 wherein said dielectric medium includes a first and second insulating layers and further includes charges selectively disposed within said insulating layers.

7. A storage system as set forth in claim 6 wherein said first insulating layer is disposed on said semiconductor substrate and is made of silicon dioxide and said second insulating layer is disposed on said layer of silicon dioxide and is made of silicon nitride.

8. A storage system as set forth in claim 3 wherein said means for selectively detecting charge includes sensing means connected to said diffusion region.

9. A storage system as set forth in claim 8 further including a metal line connecting said sensing means to said diffusion region and wherein said conductive films are made of doped polysilicon.

10. A storage system as set forth in claim 8 further including a second diffusion region similar to said first diffusion region and spaced apart therefrom, said plurality of devices being disposed between and adjacent to said first and second diffusions and said sensing means being connected to both of said diffusion regions.

11. A storage system comprising:
    a semiconductor substrate of a first conductivity type;
    first and second spaced apart diffusion regions each of a second conductivity type disposed within said substrate;
    means for providing simultaneously a plurality of contiguous potential wells of different capacity within said substrate extending from said first to said second diffusion regions;
    means for transferring charge from said diffusion regions to said wells; and
    means coupled to said diffusion regions for detecting charge stored in said potential wells.

12. A storage system as set forth in claim 11 wherein said means for providing a plurality of contiguous potential wells includes a plurality of devices having two different voltage thresholds.

13. A storage system comprising:
    a semiconductor substrate of a first conductivity type;
    a diffusion region of a second conductivity type disposed within said substrate;
    means including an insulating layer disposed on said substrate and a plurality of conductive films disposed adjacent to each other on said insulating layer and adjacent to said diffusion region for forming a plurality of semiconductor devices having first and second voltage thresholds;
    means coupled to said diffusion region for storing charge in each of said devices;
    means for selectively transferring charge from each of said plurality of devices to said diffusion region; and
    sensing means coupled to said diffusion region for detecting the charge transferred to said diffusion region from said devices.

14. A storage system as set forth in claim 13 wherein said substrate has first and second regions of different impurity levels of said first conductivity type and said devices include a first given number of films of said plurality of films aligned with said first regions for forming said devices having said first threshold voltage and a second given number of films of said plurality of films aligned with said second regions for forming said devices having said second threshold voltage.

15. A read-only storage system comprising:
    a semiconductor substrate having a plurality of diffusion regions;
    a plurality of parallel word lines coupled to said substrate and arranged in an overlapping relationship to each other and interposed between two adjacent diffusion regions;
    a plurality of devices each including a portion of one of said word lines and exhibiting different voltage thresholds; and
    means including a bit/sense line coupled to said diffusion regions for selectively detecting the voltage threshold of each of said devices.

16. A storage system comprising:
    a semiconductor substrate of a first conductivity type;
    a plurality of diffusion regions of a second conductivity type disposed within said substrate;
    a first data line connected to each of said diffusions;
    a plurality of sets of storage cells disposed within said substrate, each of said sets being interposed between different adjacent pairs of said diffusion regions;

means for selectively transferring charge to one set of said plurality of sets of cells from its pair of adjacent diffusion regions; and means for selectively detecting charge stored in one of said cells of said one set of cells through said first data line.

17. A storage system as set forth in claim 16 wherein said detecting means includes a sense amplifier coupled to said first data line, wherein each of said cells includes a device having a voltage threshold and a second data line and wherein said charge transfer means includes means for applying a voltage to the second data lines of said one set having a magnitude substantially greater than that of said threshold voltage and for applying a voltage to the second data lines of the remaining sets of said plurality of sets of cells having a magnitude less than that of said threshold voltage.

18. A storage system as set forth in claim 17 wherein said devices have different threshold voltages, a number of said devices having a given threshold voltage and the remaining devices having a threshold voltage higher than that of said given threshold voltage, wherein said first data line is a bit/sense line and said second data lines are word lines arranged orthogonal to said bit/sense line and wherein said voltage applying means applies a voltage to the word lines of said one set having a magnitude greater than that of said higher threshold voltage and for applying a voltage to the word lines of the remaining sets of said plurality of sets of cells having a magnitude less than that of said given threshold voltage.

* * * * *